United States Patent
Li et al.

(10) Patent No.: US 7,075,156 B1
(45) Date of Patent: Jul. 11, 2006

(54) COLLECTOR STRUCTURE FOR ELECTROSTATIC DISCHARGE PROTECTION CIRCUITS

(75) Inventors: Choy Li, Saratoga, CA (US); Xin-Yi Zhang, Cupertino, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 10/988,382

(22) Filed: Nov. 12, 2004

Related U.S. Application Data

(63) Continuation-in-part of application No. 10/412,076, filed on Apr. 9, 2003, now Pat. No. 6,818,955.

(51) Int. Cl.
H01L 23/62 (2006.01)
H01L 27/082 (2006.01)

(52) U.S. Cl. .............. 257/355; 257/361; 257/362; 257/197; 257/556; 257/564; 257/560; 257/557; 257/E27.053; 257/E27.055

(58) Field of Classification Search .......... 257/355, 257/361, 362, 197, 556, 564, 560, 557, 573, 257/E27.053, E27.055, E27.056, E27.057
See application file for complete search history.

(56) References Cited

U.S. PATENT DOCUMENTS

| | | | |
|---|---|---|---|
| 5,831,316 A | 11/1998 | Yu et al. | |
| 5,852,315 A | 12/1998 | Ker et al. | |
| 5,892,262 A | 4/1999 | Wu et al. | |
| 5,977,594 A | 11/1999 | Takao | |
| 6,215,157 B1 | 4/2001 | Fukuda | |
| 6,255,696 B1 | 7/2001 | Fu | |
| 6,268,639 B1 | 7/2001 | Li et al. | |
| 6,274,909 B1 | 8/2001 | Chang et al. | |
| 6,310,379 B1 | 10/2001 | Andresen et al. | |
| 6,399,990 B1 | 6/2002 | Brennan et al. | |
| 6,407,414 B1 | 6/2002 | Yu | |
| 6,417,541 B1 | 7/2002 | Cai et al. | |
| 6,424,013 B1 | 7/2002 | Steinhoff et al. | |
| 6,441,437 B1 | 8/2002 | Gossner | |
| 6,441,438 B1 | 8/2002 | Shih et al. | |
| 6,462,380 B1 | 10/2002 | Duvvury et al. | |
| 6,465,768 B1 | 10/2002 | Ker et al. | |
| 6,476,422 B1 | 11/2002 | Yu | |
| 6,501,137 B1 | 12/2002 | Yu et al. | |
| 6,501,632 B1 | 12/2002 | Avery et al. | |

(Continued)

OTHER PUBLICATIONS

U.S. Appl. No. 10/412,099, Office Action mailed Jan. 28, 2004.

(Continued)

*Primary Examiner*—Kenneth Parker
*Assistant Examiner*—Joseph Nguyen

(57) ABSTRACT

Electrostatic discharge (ESD) devices for protection of integrated circuits are described. ESD devices may be configured to provide uniform breakdown of finger regions extending through a first region of a substrate having a first conductivity type and into a second region of the substrate more lightly doped with impurities of the first conductivity type. Such an EDS device may include a collector region having a middle region highly doped with impurities of the first conductivity type. The middle region may be proximate to a layer that is lightly doped with impurities of the first conductivity type and a layer that is doped with impurities of the second conductivity type. The collector region may decrease the breakdown voltage of the EDS device. The lightly doped region may be eliminated in the collector region and an interlayer insulating layer is formed in contact with the top side regions and the middle region.

24 Claims, 7 Drawing Sheets

U.S. PATENT DOCUMENTS 6,504,216 B1   1/2003   Tang et al.
6,521,952 B1   2/2003   Ker et al.
6,639,283 B1   10/2003   Hung et al.
6,661,060 B1   12/2003   Lee et al.
6,818,955 B1 *   11/2004   Li et al. ..................... 257/355

2003/0047786 A1   3/2003   Lee et al.

OTHER PUBLICATIONS

U.S. Serial No. 10/412,076, Application filed Apr. 9, 2003.

* cited by examiner

COLLECTOR STRUCTURE FOR ELECTROSTATIC DISCHARGE PROTECTION CIRCUITS

This application is a continuation-in-part application of co-pending U.S. patent application Ser. No. 10/412,076 entitled "ELECTROSTATIC DISCHARGE PROTECTION" and filed on Apr. 9, 2003, now U.S. Pat. No. 6,818,955 the disclosure of which is incorporated herein by reference in its entirety as part of the specification of this application.

TECHNICAL FIELD

This invention relates to electrostatic discharge protection.

BACKGROUND

Electrostatic discharge (ESD) can damage integrated circuits (ICs). ESD is caused when a source of electrostatic potential (e.g., a human body with a static buildup of charge carriers) comes into contact with a circuit input. The electrostatic voltage may damage sensitive ICs if it discharges through circuit elements.

In order to prevent damage to functional circuits on the IC due to ESD, protective circuits may be incorporated on the input/output pads of the IC. Rather than discharging through functional circuit elements, electrostatic potential is discharged through the protective ESD device.

FIGS. 1A–1C show a protective circuit 100 with a lateral NPN device (referred to also as a gateless NMOS structure) including one or more fingers 105. Protective circuit 100 includes a base contact region 110 of p-type conductivity having one or more contacts 115. Generally, region 110 is more highly doped than a p-well region 160 in a substrate. Herein, the term "more highly doped" refers to a region with a net impurity concentration that is higher than the region to which it is being compared. Similarly, "more lightly doped" refers to a region with a net impurity concentration that is lower than the region to which it is being compared.

Circuit 100 includes one or more emitter regions 120 having one or more contacts 125, and one or more collector regions 140 having one or more contacts 145. Circuit 100 includes field oxide regions 130 between regions 120 and 140. Emitter regions 120, collector regions 140, and portions 165 of p-well region 160 (which act as base regions) form natural npn transistors. A field oxide region 150 separates region 110 from the fingers of the lateral NPN (also referred to as a gateless NMOS structure). In an implementation, emitter regions 120 may be coupled with one or more power sources, while collector regions 140 may be coupled with one or more pads.

In normal operation, the base is grounded. If there is an ESD event (e.g., a pad of the IC experiences an electrostatic potential), there is a reverse junction breakdown in the npn transistor. The electrostatic potential is initially discharged as current which flows from collector regions 140 to p+ region 110.

FIG. 1C shows a schematic of the natural npn transistor structures formed in circuit 100. A first resistance $R_1$ exists between the base portion of the edge npn structure and region 110. A second resistance $R_2$ exists between the base regions of adjacent npn structures.

When an ESD stress is applied to an input/output pad of the IC, the breakdown voltage of the appropriate pn junction is exceeded, the discharge current or pulse transient current is initially conducted out of the ESD structure from collector regions 140 to p+ region 110.

The structure shown in FIGS. 1A–1C may be modified. For example, the structure may be modified so that the npn transistor breaks down at a lower voltage. FIG. 1D shows a collector region 140 that may be used to lower the breakdown of an ESD structure. Collector region 140 may include p-pockets 170 beneath the outer portions of n+ collector regions 140. P-doping a region underneath the n+ region allows the ESD structure to break down at a lower voltage.

P-pockets 170 are generally formed using an "ESD implant;" that is, an implant step in a p– region is implanted under n– regions, but in which the protected circuit is not implanted. This additional processing step may add cost and complexity to the fabrication of the IC.

SUMMARY

In general, in one aspect, an integrated circuit may include an electrostatic discharge structure and a plurality of semiconductor structures to process data, such as one or more transistors. The electrostatic discharge structure may discharge an electrostatic voltage applied to a pad of the integrated circuit such as an input pad or an output pad. The electrostatic discharge structure may therefore reduce or prevent damage to the semiconductor structures.

In general, in another aspect, a collector region of an electrostatic discharge device may include a middle region of a first conductivity type, top side regions of the first conductivity type, and bottom side regions of a second conductivity type. The first conductivity type may be n-type and the second conductivity type may be p-type. In an implementation, the top side regions may be more lightly doped with n-type impurities, the bottom side regions may be p-pocket regions, and the middle region may be a highly doped with n-type impurities.

A process for forming such a collector region in an electrostatic discharge device may include forming a layer of a first conductivity type in a first process using a first mask. The method may further include forming a layer of a second conductivity type proximate to the layer of the first conductivity type in a second process using the first mask. The process may include forming the middle region using a second mask.

The process described above to form collector regions for an ESD device may be integrated with the formation of regions of the first and second conductivity types near gate electrodes of transistors included in the circuits to be protected by the ESD device. That is, the layer of the first conductivity type formed using the first mask may be accomplished as a region of the first conductivity type is formed proximate to gate electrodes in the circuit to be protected. Similarly, the layer of the second conductivity type formed using the first mask may be accomplished as a region of the second conductivity type is formed proximate to the gate electrodes.

Another aspect includes electrostatic discharge structures having collector regions that do not have the lightly doped region of the same conductivity type as the middle region. One embodiment of the collector region in such an electrostatic discharge structure includes a middle region of a first conductivity type, two side regions of a second conductivity type and two bottom side regions of the second conductivity type. The middle region includes a first side and a second side opposite the first side and extends downward from a first level to a second level. The top side regions are proximate to the first side and the second side of the middle region and extends downward from the first level to an intermediate level. The bottom side regions are proximate to the first side and the second side of the middle region and located under the top side regions to extend downward from the intermediate level down to the about the second level. The doping densities of the top side regions and the bottom side regions are different. This collector region further includes an interlayer insulating layer above and in contact with the top side regions and the middle region.

This application describes an exemplary device which includes an electrostatic discharge structure. The electrostatic discharge structure includes a collector region. The collector region includes a middle region of a first conductivity type comprising a first side and a second side opposite the first side. The middle region extends downward from a first level to a second level. The collector region also includes top side regions of a second conductivity type proximate to the first side and the second side of the middle region and extending downward from the first level to an intermediate level, bottom side regions of the second conductivity type proximate to the first side and the second side of the middle region and located under the top side regions and extending downward from the intermediate level down to the about the second level, and an interlayer insulating layer above and in contact with the top side regions and the middle region. The doping densities of the top side regions and the bottom side regions are different.

This application further describes a device that includes an integrated circuit. The integrated circuit includes at least one semiconductor circuit structure to process data, at least one pad coupled to the at least one semiconductor circuit structure, and an electrostatic discharge structure coupled to the at least one pad and operable to discharge electrostatic potential applied to the at least one pad. The electrostatic discharge structure includes a collector region. The collector region includes a middle region of a first conductivity type comprising a first side and a second side opposite the first side and extending downward from a first level to a second level, top side regions of a second conductivity type proximate to the first side and the second side of the middle region and extending downward from the first level to an intermediate level, bottom side regions of the second conductivity type more lightly doped that the top side regions, an interlayer insulating layer formed on top of and in contact with the middle region and the top side regions, and a patterned metal layer on the interlayer insulating layer. The bottom side regions are proximate to the first side and the second side of the middle region and under the top side regions to extend downward from the intermediate level down to about the second level.

The details of one or more implementations are set forth in the accompanying drawings and the description below. Other features and advantages will be apparent from the description and drawings, and from the claims.

DESCRIPTION OF DRAWINGS

Like reference symbols in the various drawings indicate like elements.

DETAILED DESCRIPTION

Figure 1A:
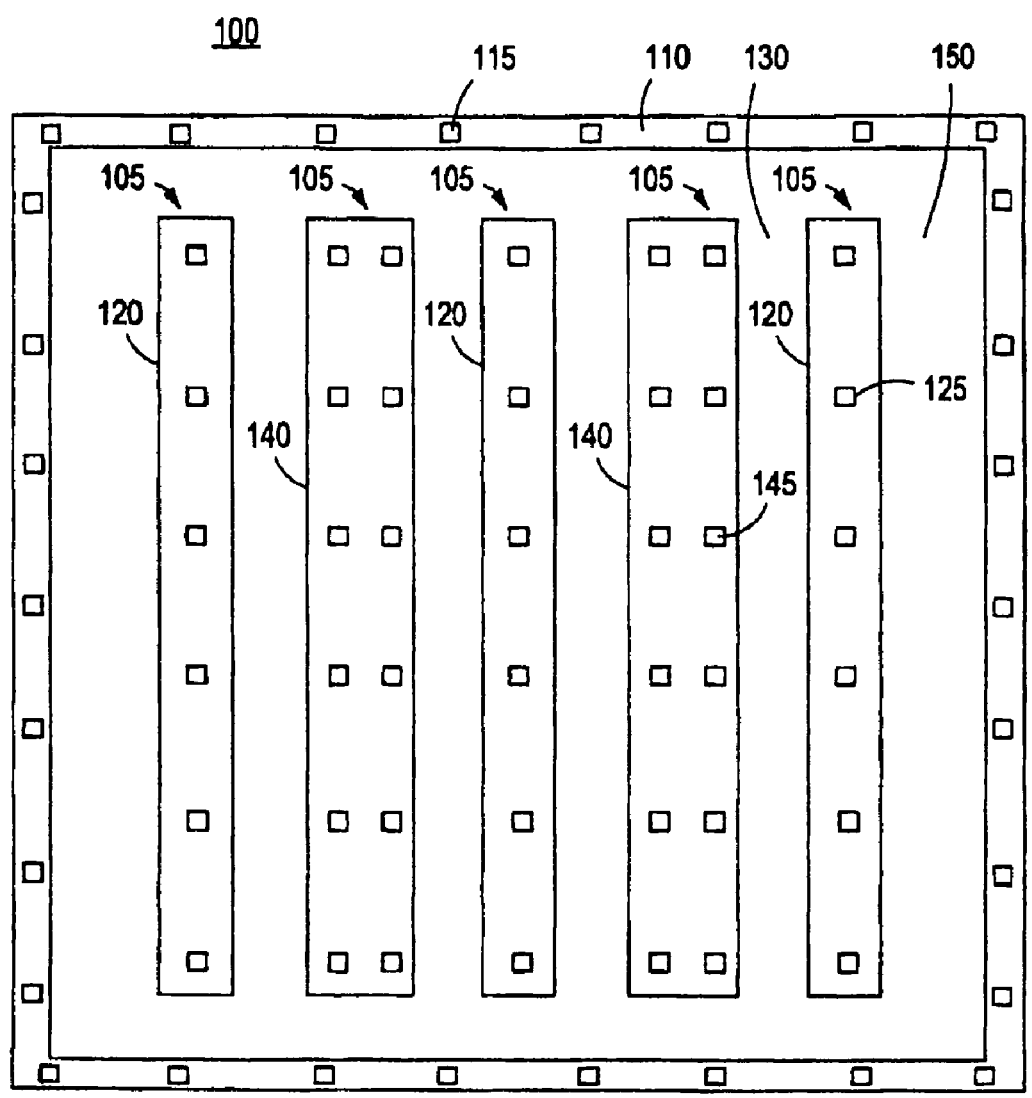
FIG. 1A shows a top view of an ESD structure.
Figure 1B:
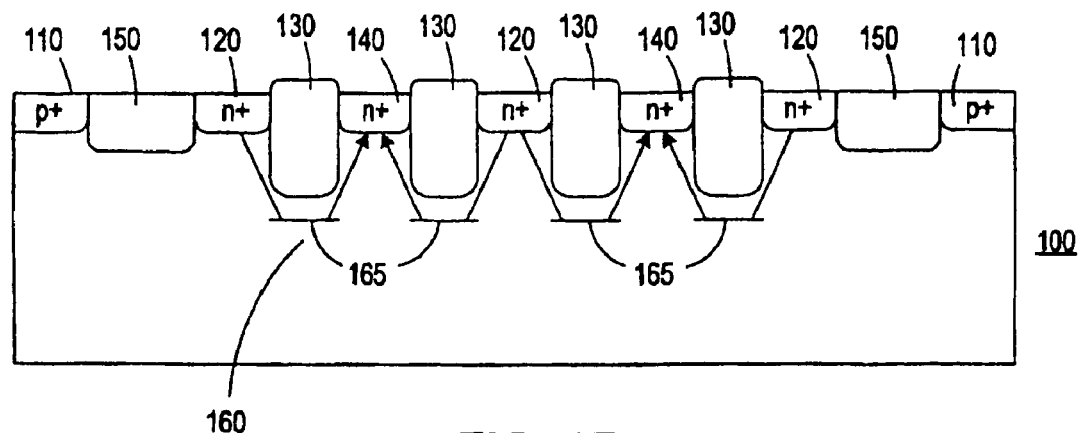
FIG. 1B shows a cross-sectional view of an ESD structure.
Figure 1C:
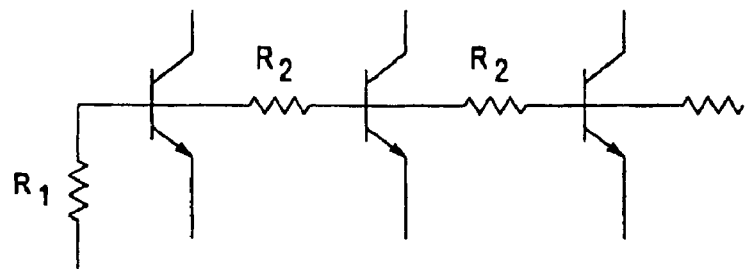
FIG. 1C shows a schematic of the natural npn transistors formed in a structure such as that shown in FIGS. 1A and 1B.

The structure of FIGS. 1A–1C may not provide effective protection against ESD, since one (or just a few) of the fingers may discharge substantially all of the electrostatic potential. Generally, the values of $R_1$ and $R_2$ are comparable (e.g., of the same order of magnitude). Since the resistance between region 110 and the base region for each of the fingers of the structure increases from the outer fingers to the inner fingers (by approximately $R_2$ for each finger), there may be an appreciable difference in resistance from one finger to the next.

For example, FIG. 1B illustrates a device with five fingers 105, and with four associated base regions 165. In general, the resistance between the base contact region and the outer base regions is about $R_1$, while the resistance between the inner base regions and the base contact region is about equal to $R_1+nR_2$, where n is the number of fingers.

As a result, junction breakdown may occur in the middle fingers of the structure before the conditions for junction breakdown in the outer fingers occur. Since the ESD discharge is a fast, high current event, the middle fingers may discharge most or all of the current. This may cause damage to circuit 100.

Figure 2A:
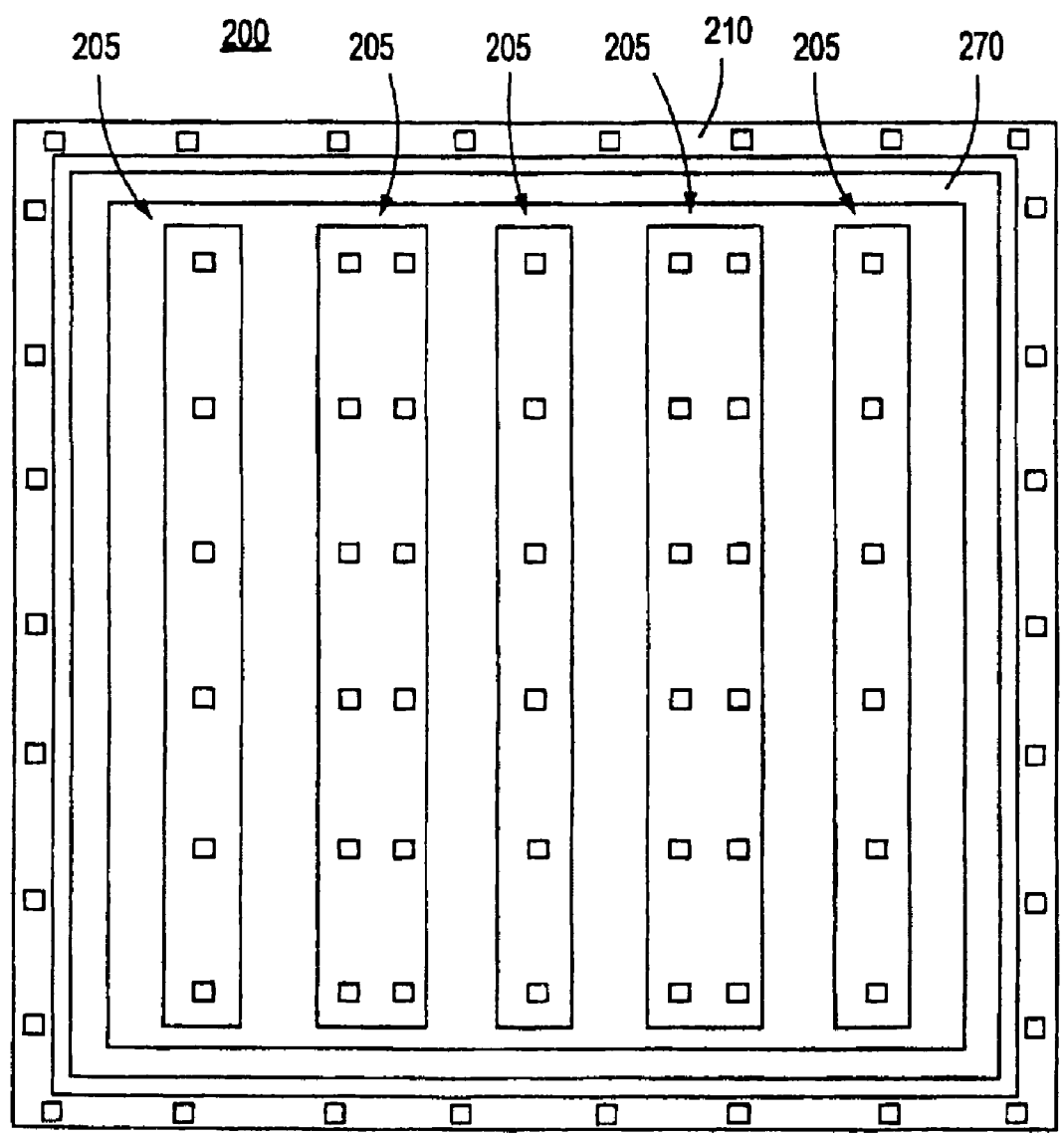
FIG. 2A shows a top view of an ESD structure.
Figure 2B:
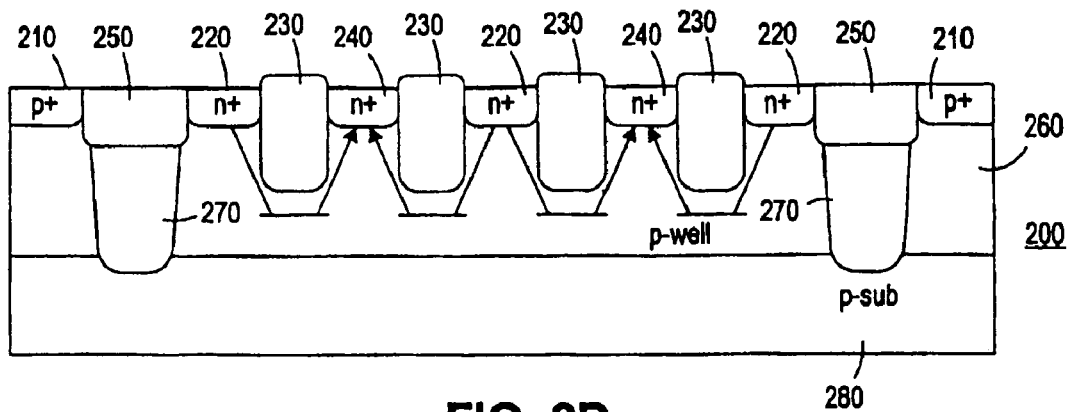
FIG. 2B shows a cross-sectional view of an ESD structure.

FIGS. 2A and 2B show an ESD device 200 that may provide more effective discharge of electrostatic potential by decreasing the difference between the resistance of the fingers of the device.

An n-well region 270 is provided between a p+ base contact region 210 and fingers 205 of structure 200. Additionally, a p-sub region 280 may be provided beneath p-well region 220, with n-well region 270 extending at least partly into p-sub region 280. The p-sub region is more lightly doped than the p-well region, and as such has a higher resistivity than the p-well region. For example, the resistivity of the p-sub region may be between about ten and about fifty times the resistivity of the p-well region, which increases the value of $R_1$ significantly. Other resistivity values may be used. Additionally, since current flowing to region 210 must travel a greater distance then in a device without n-well region 270, the value of $R_1$ is further increased by virtue of the longer current path.

As a result, the value of $R_1$ may be much larger than the value of $R_2$. For example, $R_1$ may be between about ten times and about 50 times the value of $R_2$ (although other values may be used, depending on the structure). The difference in resistance between adjacent fingers, $R_2$, is then a small percentage of the total resistance $R_1+nR_2$ between the particular base region and the base contact region (where n refers to the number of base regions between the particular base region and the edge base region). Therefore, each of the npn structures reaches the point of junction breakdown at about the same time, allowing the ESD to be discharged through all of the fingers rather than through a single finger or a few fingers.

Figure 2C:
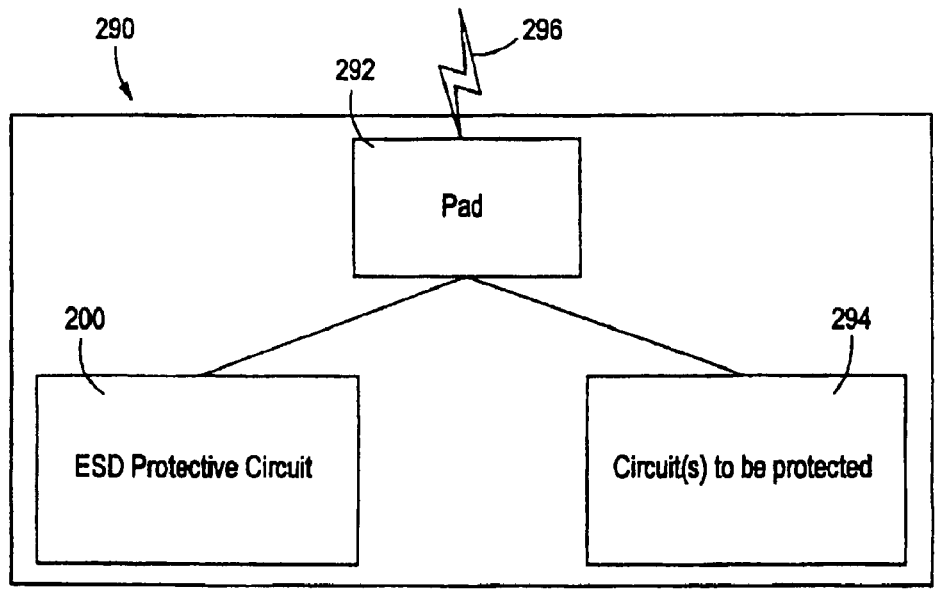
FIG. 2C shows an integrated circuit including an ESD structure such as the structure of FIGS. 2A and 2B.

FIG. 2C shows an integrated circuit 290 that includes an ESD protective circuit 200 such as that shown in FIGS. 2A and 2B. Integrated circuit 290 includes one or more input and/or output pads such as pad 292. Pad 292 is coupled with both protective circuit 200 and one or more circuits to be protected 294.

When an ESD event 296 occurs, protective circuit 200 discharges some or all of the electrostatic potential, as described above. Circuits 294 may thus be protected from damage.

The structures shown in FIGS. 2A–2C may provide for enhanced ESD protection over previous systems and techniques. However, another problem that may arise with an ESD structure such as that shown in FIGS. 1A–1C is that the breakdown voltage of the ESD structure may not be low enough to provide sufficient protection for the IC to be protected.

Figure 1D:
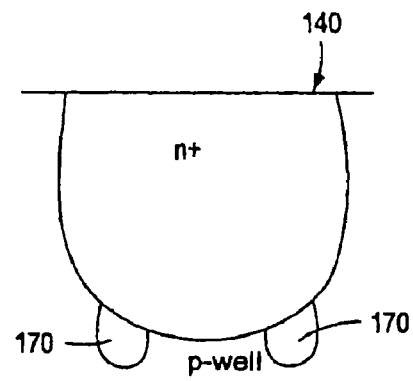
FIG. 1D shows a collector region to lower the breakdown voltage of a natural npn structure such as that shown in FIGS. 1A and 1B.
Figure 3:
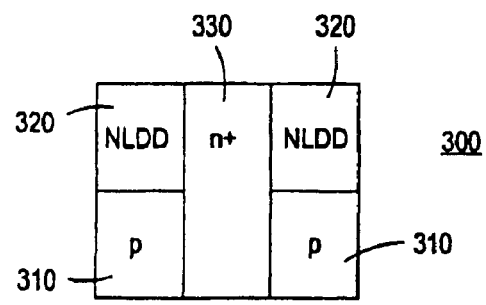
FIG. 3 shows a collector region that may be used in an ESD structure such as that shown in FIGS. 2A and 2B.

As stated above, the structure of FIG. 1D may decrease the breakdown voltage of the ESD structure, but may add cost and complexity to the fabrication of ICs. FIG. 3 shows a collector region 300 that may be produced during fabrication steps for MOSFET structures in the ICs to be protected. That is, collector region 300 may lower the breakdown voltage of the ESD device without requiring an implant step for the ESD structure only. Therefore, the structure of collector region 300 may provide a similar benefit without the additional cost and complexity.

When forming a MOS structure, a p-pocket region and a lightly doped n region (NLDD region) may be formed under the gate electrode, adjacent to the source and drain. Generally, the p-pocket region is more highly doped than the p-well region, but more lightly doped than the p+ region. P-pocket region 310 and NLDD region 320 of collector region 300 are formed in the same processing steps that the p-pocket and NLDD structures are formed in the MOS structures of the IC to be protected. Collector region 300 includes a p-pocket region 310 and a lightly doped n region (an NLDD region) 320 next to a middle n+ region 330 of collector region 300.

Figure 4A:
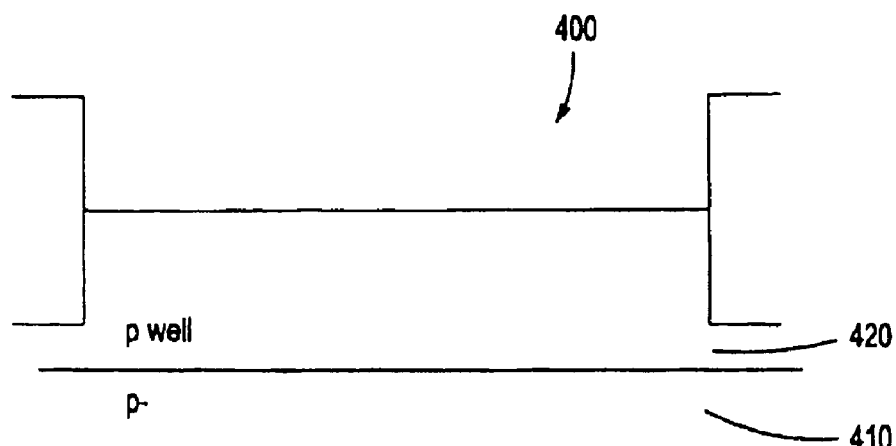
FIGS. 4A–4C show a fabrication process for forming collector regions such as the collector region shown in FIG. 3.
Figure 4B:
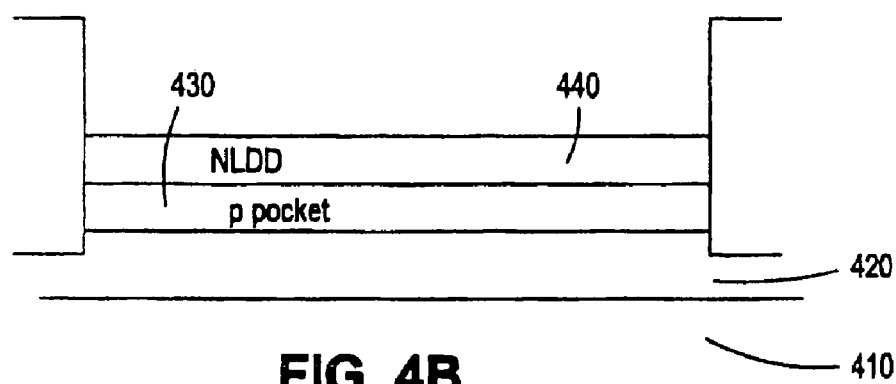
Figure 4C:
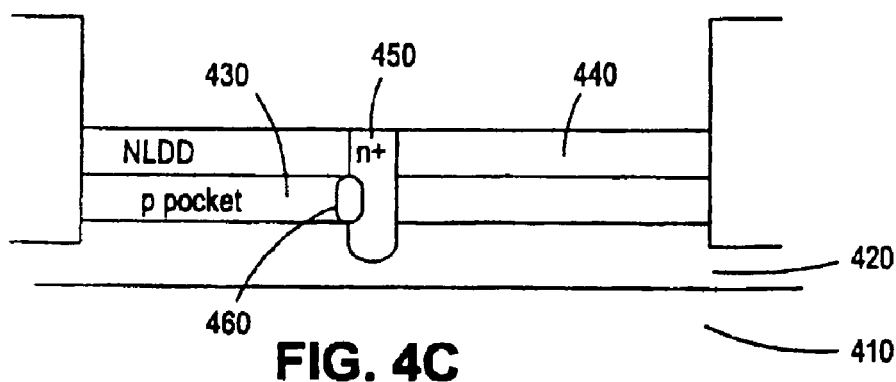

FIGS. 4A–4C show a fabrication process for forming collector regions such as collector region 300 of FIG. 3. In FIG. 4A, a region 400 includes a p– region 410 and a p-well 420. As shown in FIG. 4B, a low dose n implant and a p implant are performed, forming p-pocket layer 430 and NLDD layer 440. As shown in FIG. 4C, a n implant is then performed, forming n+ region 450. The interface between n+ region 450 and p-pocket 430 (for example, a region 460) may facilitate breakdown of the ESD device at a lower voltage.

Figure 5:
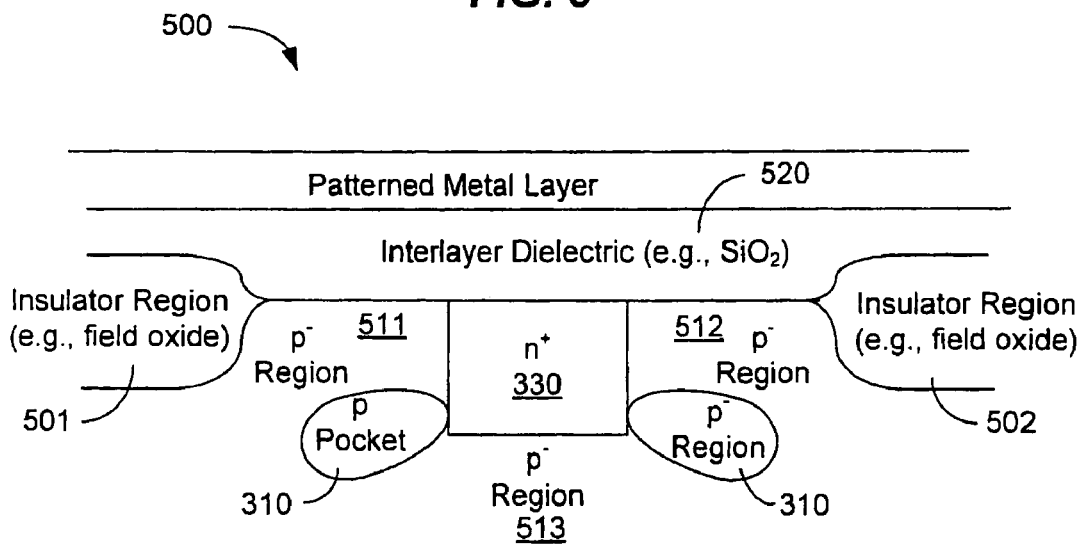
FIG. 5 shows a first example of a collector region for an ESD device without the lightly doped n regions in FIG. 3.

FIG. 5 shows one embodiment of an alternative collector structure or region 500 in an ESD device without the lightly doped n region (NLDD) 320 shown in FIG. 3. The collector structure 500 can also reduce the breakdown voltage of the ESD device. As illustrated in the specification implementation shown in FIG. 5, the collector structure 500 includes insulator regions 501 and 502 such as field oxide (e.g., SiO$_2$) regions to define the area in a p$^-$ doped semiconductor layer on the substrate for forming the collector structure. A heavily n-doped region 330 (n$^+$) is formed between a first level and a second level in the p$^-$ doped semiconductor layer between the insulator regions 501 and 502. In addition, two p-doped regions 310 are formed as p pockets on two opposing sides of the lower part of the n$^+$ region 310. The pockets 310 are in contact with the n+ region 330 and divide the p$^-$ doped region in the semiconductor layer into regions 511, 512, and 513. The regions 511 and 512 are located adjacent to the n$^+$ region 330 and are on top of the p pockets 310. An interlayer insulating layer 520, e.g., a dielectric layer such as SiO$_2$, is also formed on top of and is in contact with the p$^-$ region 511, the n+ region 330, and the p$^-$ region 512. The interlayer insulating layer 520 separates the p$^-$ region 511, the n+ region 330, and the p$^-$ region 512 from any layer formed above the interlayer insulating layer 520.

One or more additional layers may be formed over the interlayer dielectric layer 520. As an example, a metallic layer such as a patterned metallic layer may be formed on the interlayer dielectric layer 520. The layer 520 may be a layer of SiO$_2$ or other insulator materials. Such additional layers with a patterned metal layer allow for connecting one or more circuit elements or devices. In addition, a passivation layer may be further formed over the interlayer dielectric layer 520 or over a metallic layer on top of the layer 520.

When implemented as part of an ESD device, the collector structure 500 is used to form the collector of a npn bipolar transistor of the ESD device as described above. Referring back to FIG. 2C, when an electrostatic surge occurs, the pn junction in the collector 500 breaks down and thus effectuates an electrical path in the ESD device for conducting a current generated from the electrostatic surge which would otherwise flow through an integrated circuit 294 and may damage or destroy the circuit 294.

Figure 6A:
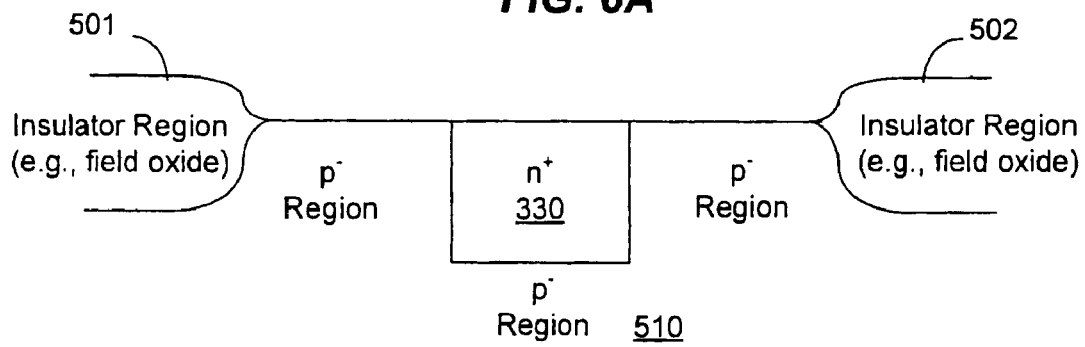
FIGS. 6A and 6B illustrate a fabrication process for fabricating the structure in FIG. 5.
Figure 6B:
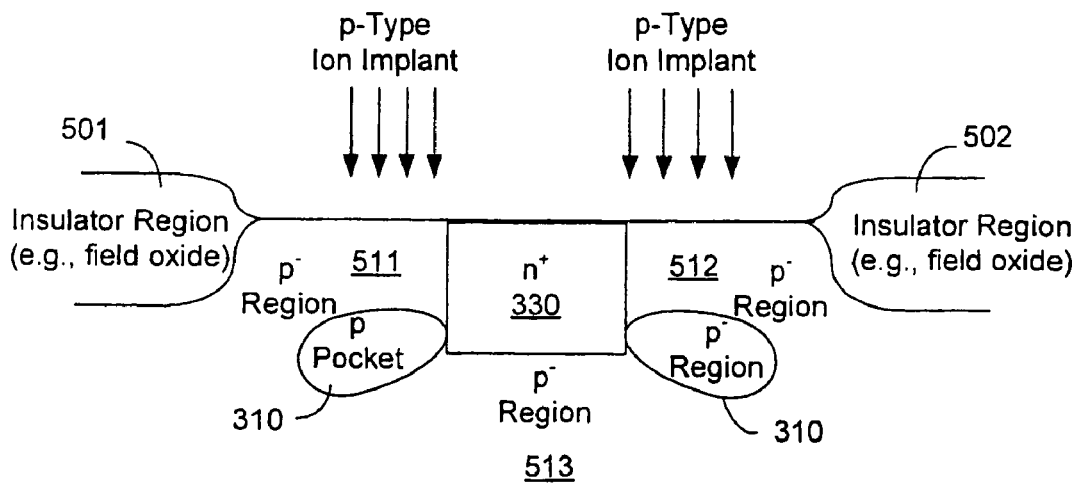

FIGS. 6A and 6B illustrate an exemplary fabrication process for fabricating the collector structure 500 in the ESD device. A substrate is first processed to form a p-layer 510 and the field oxide regions 501 and 502 to define the area where the collector region is to be formed. Then, n-type ions are implanted in the layer 510 between the field oxides 501 and 502 to form a middle region 330 extending from a first level to a second level within the layer 501. These regions form the structure shown in FIG. 6A. Next, p-type ions are implemented in the p– region 510 on two opposite sides of the n+ region 330 to form the two p pockets 310 (FIG. 6B). The ion implantation is controlled so that the density of the p-type ions in the p pockets 310 is higher than that in the adjacent p$^-$ regions 511, 512, and 512. Upon formation of the p pockets 310, an interlayer dielectric layer 520 is subsequently formed on top of the regions 511, 330, 512, 501, and 502 to separate the regions 511, 330, 512 from other layers on top of the layer 520. A first metal layer is formed on the interlayer dielectric layer 520 and is patterned, e.g., via an etching process, in a selected configuration. Various different configurations may be formed in this first metal layer for different applications. A passivation layer may be further formed over the first metal layer to protect the underlying patterned structure.

Figure 7:
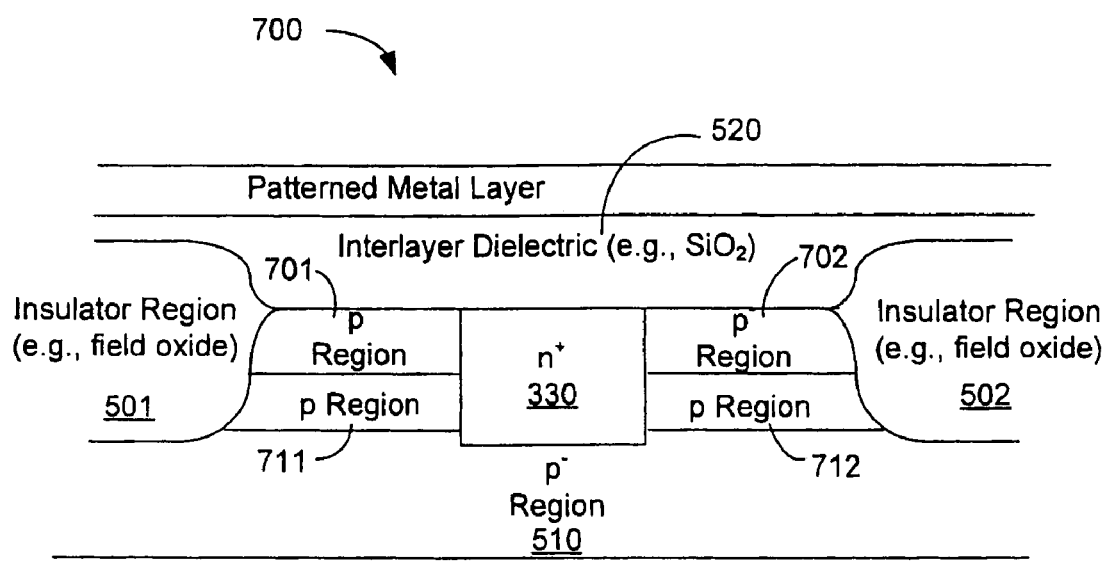
FIG. 7 shows a second example of a collector region for an ESD device without the lightly doped n regions in FIG. 3.

FIG. 7 shows another example of a collector region 700 without the NLDD regions 320 in FIG. 3 where the two p pockets 310 on two sides of the n+region 330 are replaced by two p layers as p regions 711 and 712 that extend between the field oxide 501 and the region 330 and the field oxide 502 and the region 330, respectively. This geometry may be achieved by implanting the p-type ions in the entire region between the region 330 and the field oxides 501 and 502. Immediately above the p regions 711 and 722 are p$^-$ regions 701 and 702 that are adjacent to the region 330 and beneath the interlayer dielectric layer 520. One or more additional layers may be formed on top of the interlayer dielectric layer 520, such as a metal layer, to form one or more circuit elements or devices on top of the interlayer insulating layer 520.

A number of implementations have been described. Nevertheless, it will be understood that various modifications may be made without departing from the spirit and scope of the invention. For example, an n-well such as the n-well 270 shown in FIG. 2B may be used with other implementations of ESD circuits. In addition, the two conductivity types illustrated the examples, such as FIGS. 3, 5 and 7, may be exchanged where the n-type region is replaced by a p-type region and vice versa. Other variations and enhancements may be possible based on features and techniques described here.

What is claimed is:

1. A device, comprising:
    an electrostatic discharge structure comprising a collector region, the collector region comprising:
    a middle region of a first conductivity type comprising a first side and a second side opposite the first side, the middle region extending downward from a first level to a second level;
    top side regions of a second conductivity type proximate to the first side and the second side of the middle region, the top side regions extending downward from the first level to an intermediate level;
    bottom side regions of the second conductivity type proximate to the first side and the second side of the middle region and located under the top side regions and extending downward from the intermediate level down to about the second level, wherein doping densities of the top side regions and the bottom side regions are different; and
    an interlayer insulating layer above and in contact with the top side regions and the middle region.

2. The device of claim 1, further comprising a metal layer on the interlayer insulating layer.

3. The device of claim 1, further comprising a passivation layer over the interlayer insulating layer.

4. The device of claim 1, wherein the top side regions are more lightly doped with the first conductivity type than the bottom side regions.

5. The device of claim 1, wherein the first conductivity type is n-type and the second conductivity type is p-type.

6. The device of claim 1, further comprising an integrated circuit in which the electrostatic discharge structure resides.

7. The device of claim 6, wherein the integrated circuit further comprises at least one functional circuit element.

8. The device of claim 1, wherein the interlayer insulating layer is a dielectric layer.

9. The device of claim 8, wherein the dielectric layer comprises silicon dioxide.

10. The device of claim 8, further comprising a metallic layer on top of the dielectric layer.

11. The device of claim 1, further comprising at least one circuit element formed on top of the interlayer insulating layer.

12. A method, comprising:
    forming an electrostatic discharge device which comprises a collector structure, wherein forming the collector structure comprises:
    forming a layer of a first conductivity type at a first doping density;
    forming a middle region of a second conductivity type within the layer of the first conductivity type to extend downward from a first level at a top surface of the layer of the first conductivity type to a second level in the layer of the first conductivity type;
    forming a layer of a first conductivity type at a second doping density greater than the first doping density inside the layer of the first conductivity type and on two opposite sides of the middle region to leave a top layer of the first conductivity type at the first doping density; and
    forming an interlayer insulating layer over the top layer of the first conductivity and the middle region of the second conductivity to separate the top layer and the middle region from any layer formed above the interlayer insulating layer.

13. The method of claim 12, further comprising forming a circuit element to be protected by the electrostatic discharge device, wherein forming the circuit element comprises forming a region of the second conductivity type proximate to a gate electrode of the circuit element and forming a region of the first conductivity type proximate to the gate electrode.

14. The method of claim 12, wherein the first conductivity type is p type and the second conductivity type is n type.

15. The method of claim 12, wherein the first conductivity type is n type and the second conductivity type is p type.

16. The method of claim 12, further comprising:
    forming a metal layer on the interlayer insulating layer; and
    patterning the metal layer.

17. The method of claim 12, further comprising forming a passivation layer over the interlayer insulating layer.

18. A device, comprising an integrated circuit which comprises:
    at least one semiconductor circuit structure to process data;
    at least one pad coupled to the at least one semiconductor circuit structure; and
    an electrostatic discharge structure coupled to the at least one pad and operable to discharge electrostatic potential applied to the at least one pad, the electrostatic discharge structure comprising a collector region which comprises:
    a middle region of a first conductivity type comprising a first side and a second side opposite the first side and extending downward from a first level to a second level,
    top side regions of a second conductivity type proximate to the first side and the second side of the middle region, the top side regions extending downward from the first level to an intermediate level,
    bottom side regions of the second conductivity type more lightly doped than the top side regions, the bottom side regions proximate to the first side and the second side of the middle region and under the top side regions to extend downward from the intermediate level down to about the second level, and
    an interlayer insulating layer formed on top of and in contact with the middle region and the top side regions.

19. The device of claim 18, wherein the collector region further comprises a patterned metal layer on the interlayer insulating layer.

20. The device of claim 19, further comprising a circuit element connected to the patterned metal layer on the interlayer insulating layer.

21. The device of claim 19, further comprising a passivation layer over the patterned metal layer and the interlayer insulating layer.

22. The device of claim 18, wherein the first conductivity type is n type and the second conductivity type is p type.

23. The device of claim 18, wherein the first conductivity type is p type and the second conductivity type is n type.

24. The device of claim 18, further comprising a circuit element formed on top of the interlayer insulating layer.

* * * * *